(12) United States Patent
Roohparvar

(10) Patent No.: US 7,046,562 B2
(45) Date of Patent: *May 16, 2006

(54) INTEGRATED CIRCUIT RESET CIRCUITRY

(75) Inventor: Frankie Fariborz Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 231 days.

This patent is subject to a terminal disclaimer.

(21) Appl. No.: 10/694,379

(22) Filed: Oct. 27, 2003

(65) Prior Publication Data

US 2004/0085838 A1 May 6, 2004

Related U.S. Application Data

(63) Continuation of application No. 10/159,085, filed on May 29, 2002, now Pat. No. 6,751,139.

(51) Int. Cl.
*G11C 29/00* (2006.01)
*G11C 7/00* (2006.01)

(52) U.S. Cl. .................. 365/201; 327/409; 327/198

(58) Field of Classification Search ............ 365/201 O, 365/226; 714/724; 327/409 X, 198 X
See application file for complete search history.

(56) References Cited

U.S. PATENT DOCUMENTS

| | | | |
|---|---|---|---|
| 5,159,369 A | 10/1992 | Hashimoto | |
| 5,412,264 A | 5/1995 | Uda | |
| 5,526,364 A | 6/1996 | Roohparvar | |
| 5,561,614 A | 10/1996 | Revilla | |
| 5,569,903 A | 10/1996 | Matsubara | |
| 5,615,159 A | 3/1997 | Roohparvar | |
| 5,636,166 A | 6/1997 | Roohparvar | |
| 5,793,775 A | 8/1998 | Roohparvar | |
| 5,949,797 A * | 9/1999 | Jung | 714/724 |
| 5,999,480 A | 12/1999 | Ong et al. | |
| 6,246,626 B1 | 6/2001 | Roohparvar | |
| 6,271,675 B1 | 8/2001 | Sakaki | |
| 6,278,654 B1 | 8/2001 | Roohparvar | |
| 6,304,497 B1 | 10/2001 | Roohparvar | |
| 6,307,779 B1 | 10/2001 | Roohparvar | |
| 6,314,049 B1 | 11/2001 | Roohparvar | |
| 6,335,648 B1 | 1/2002 | Matsushita | |
| 6,442,076 B1 | 8/2002 | Roohparvar | |
| 6,542,427 B1 | 4/2003 | Roohparvar | |
| 6,556,478 B1 * | 4/2003 | Willis et al. | 365/185.09 |
| 2001/0003837 A1 | 6/2001 | Norman et al. | |
| 2002/0075745 A1 | 6/2002 | McLaury | |
| 2002/0129193 A1 | 9/2002 | Roohparvar | |
| 2002/0178414 A1 | 11/2002 | Roohparvar | |
| 2003/0023840 A1 | 1/2003 | Zitlaw et al. | |
| 2003/0046486 A1 | 3/2003 | Zitlaw | |

* cited by examiner

*Primary Examiner*—Van Thu Nguyen
(74) *Attorney, Agent, or Firm*—Leffert Jay & Polglaze, P.A.

(57) ABSTRACT

An integrated circuit includes a reset connection to reset the device in response to an externally provided signal. The reset connection is used during test operations to receive elevated supply voltages. The reset connection is coupled to a bias circuit to maintain an inactive state such that the integrated circuit is not reset during the test operation when the reset connection is not actively driven by the external supply.

19 Claims, 2 Drawing Sheets

INTEGRATED CIRCUIT RESET CIRCUITRY

RELATED APPLICATION

This Application is a Continuation of U.S. application Ser. No. 10/159,085 filed May 29, 2002 now U.S. Pat. No. 6,751,139, which is incorporated herein by reference.

FIELD OF THE INVENTION

The present invention relates generally to integrated circuits and in particular the present invention relates to integrated circuit memory devices.

BACKGROUND OF THE INVENTION

It is desirable to test the operation of integrated circuits during manufacturing. There are numerous ways of testing integrated circuits that reduce test time and expense, as known in the art. One method uses elevated voltages during testing. These elevated voltages are supplied to the device under test on an input connection. As operating speeds increase, the input connections and corresponding circuitry are changing.

In high-speed memory devices, input connection circuits are typically designed to operate at high signal speeds and are performance intensive. These circuits, therefore, are not designed to receive high voltage test signals or supplies. That is, the circuits usually include transistors with thin gate oxide for speed performance and, unlike transistors with thick oxide, cannot sustain higher voltages, such as the elevated test supply voltages.

For the reasons stated above, and for other reasons stated below which will become apparent to those skilled in the art upon reading and understanding the present specification, there is a need in the art to provide voltage supplies during test operations of an integrated circuit.

SUMMARY OF THE INVENTION

The above-mentioned problems with integrated circuits and other problems are addressed by the present invention and will be understood by reading and studying the following specification.

In one embodiment, a memory device comprises control circuitry to place the memory device in a test mode, and a reset connection to receive an externally provided active low reset signal to reset the memory device. The reset connection can receive an elevated voltage during the test mode. An input buffer circuit is coupled to the reset connection, and a pull-up bias circuit coupled to the reset connection, wherein the pull-up bias circuit is active only during the test mode.

In another embodiment, a synchronous non-volatile memory device comprises an array of non-volatile memory cells, control circuitry to place the memory device in a test mode in response to an external test command, and a supply connection to receive a voltage supply, Vcc. A reset connection is provided to receive an externally provided active low reset signal to reset the memory device. The reset connection can receive an elevated voltage during the test mode, where the elevated voltage is greater than Vcc. An input buffer circuit is coupled to the reset connection, and a pull-up bias circuit coupled to the reset connection, wherein the pull-up bias circuit is active only during the test mode.

A method of operating a memory device comprises initiating a test operation of the memory device, and activating a bias circuit coupled to a reset connection of the memory device during the test operation.

A method of operating a non-volatile memory device comprises initiating a test operation of the memory device via externally provided commands, activating an internal pull-up bias circuit coupled to a reset connection of the memory device, and coupling active low reset signals to the reset connection during a test operation using a first tester. The method includes disconnecting the first tester from the reset connection such that the reset connection is not actively driven from an outside source, wherein the activated pull-up bias circuit prohibits a voltage on the reset connection from transitioning to a low state. An elevated supply voltage is coupled to the reset connection during the test operation, wherein the elevated voltage supply is greater than a memory voltage supply, Vcc.

BRIEF DESCRIPTION OF THE DRAWINGS

FIG. 4 is a schematic diagram of another embodiment of a memory of the present invention including a pull-up circuit.

DETAILED DESCRIPTION OF THE DRAWINGS

In the following detailed description of the preferred embodiments, reference is made to the accompanying drawings, which form a part hereof, and in which is shown by way of illustration specific preferred embodiments in which the inventions may be practiced. These embodiments are described in sufficient detail to enable those skilled in the art to practice the invention, and it is to be understood that other embodiments may be utilized and that logical, mechanical and electrical changes may be made without departing from the spirit and scope of the present invention. The following detailed description is, therefore, not to be taken in a limiting sense, and the scope of the present invention is defined only by the claims.

Integrated circuit devices often include a reset input connection used to reset the device operation in response to an active state of a reset signal. For example, memory devices often include connections used to reset the memory in response to an externally provided active-low reset signal. Embodiments of the present invention allow an integrated circuit to use its reset connection for test implementation. A bias circuit can be selectively activated to bias the reset connection in a non-active state during test operations. Test signals and voltage supplies can be selectively provided on the reset connection without triggering a device reset, as explained below.

The integrated circuit of the present invention can be any type of integrated circuit. In one embodiment the integrated circuit is a memory device. Numerous different memory devices are available for different applications, and the present invention is not limited to any one style. The memory can be dynamic random access memory (DRAM) or a synchronous DRAM (SDRAM) that can run at much higher clock speeds than conventional DRAM memory. SDRAM synchronizes itself with a clock bus and can be accessed quickly, but are volatile. Similarly, synchronous non-volatile flash memories are know, see "Protection after brown out in a synchronous memory" U.S. Pat. No. 6,246,626 to Roohparvar, issued Jun. 12, 2001 for a description of a synchronous flash memory.

Figure 1:
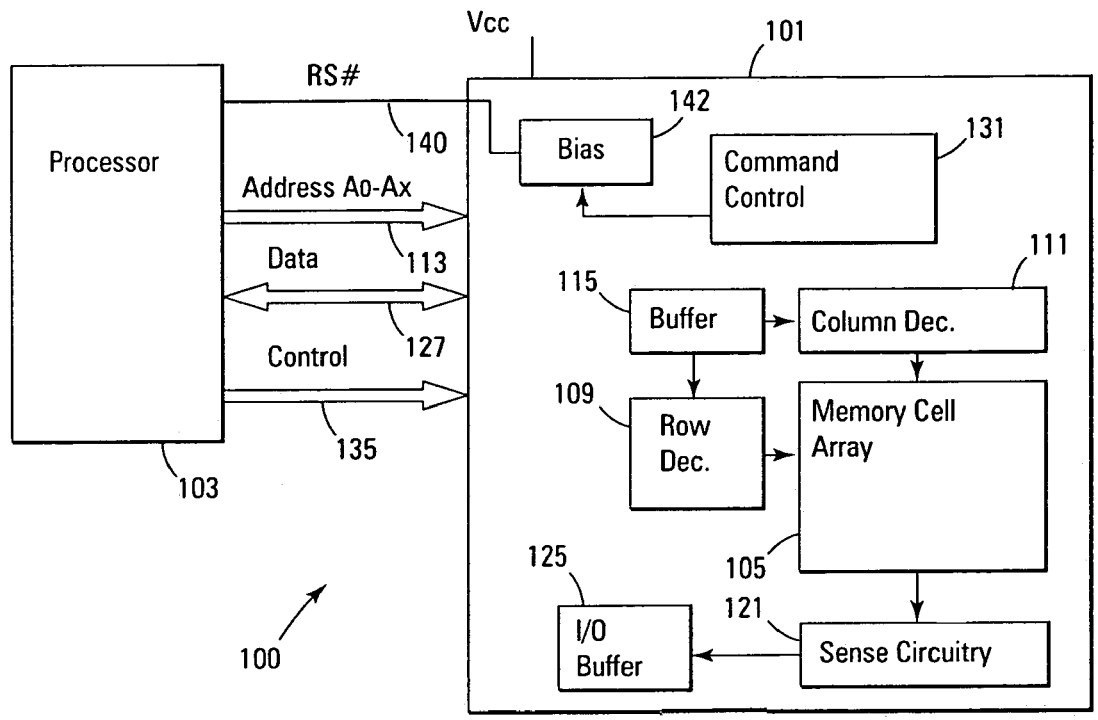
FIG. 1 is a functional block diagram of a flash memory device of one embodiment of the present invention coupled to a processor.

FIG. 1 is a functional block diagram of a flash memory device 101, of one embodiment of the present invention, that is coupled to a processor 103. The memory device 101 and the processor 103 may form part of an electronic system 100. The memory device 101 has been simplified to focus on features of the memory that are helpful in understanding the present invention. The memory device 101 includes an array of memory cells 105. The memory cells are preferably non-volatile floating-gate memory cells and generally have their control gates coupled to word lines, drain regions coupled to local bit lines, and source regions commonly coupled to a ground potential. The memory array 105 is arranged in rows and columns, with the rows arranged in blocks. The memory cells generally can be erased in blocks. Data, however, may be stored in the memory array 105 separate from the block structure.

An address buffer circuit 115 is provided to latch address signals provided on address lines A0–Ax 113. Address signals are received and decoded by row decoder 109 and a column decoder 111 to access the memory array 105. Sensing circuitry 121 is used to sense and amplify data stored in the memory cells. Data input and output buffer circuitry 125 is included for bi-directional data communication over a plurality of data (DQ) lines 127 with the processor 103.

Command control circuit 131 decodes signals provided on control lines 135 from the processor 103. These signals are used to control the operations on the memory array 105, including data read, data write, and erase operations. Command control is also used to enter a test mode, or operation, in response to external commands. During test modes, the command circuit activates a bias circuit 142 coupled to the active low reset connection 140, RS#. As stated above, the flash memory device 101 has been simplified to facilitate a basic understanding of the features of the memory. A more detailed understanding of flash memories is known to those skilled in the art.

As described above, input connection circuits that are performance sensitive do not typically include transistors with thick oxide desired for high voltage operation. As such, performance sensitive inputs are not ideal for receiving test supply voltages. This problem may be overcome by using much larger transistors with thin gate oxides. The end result, however, would be an increased die size and input capacitance that may cause lower performance on the system level. A solution of the present invention is the use of a Reset connection used to put the integrated circuit device in a known reset condition and/or a lower current mode. The input signals provided on the reset connection are not high-speed performance sensitive signals. As such, an input buffer circuit coupled to the reset connection can include thicker gate oxide transistors and lower performance devices without compromising the functionality of the connection.

In memory devices, the Reset signal is usually an active low signal. The present invention, however, is not limited to an active low input signal. During testing of the memory devices currents or voltages are supplied externally by a tester to reduce the test time and hence the test cost. The reset connection, sometimes referred to as a rest pin, is used as the supply pin for these voltages or currents.

Figure 2:
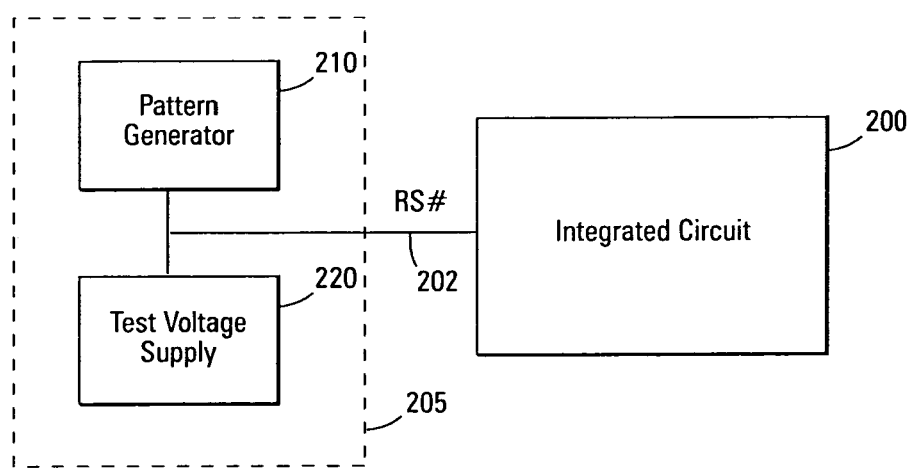
FIG. 2 illustrates an integrated circuit coupled to testers during a test operation.

Referring to FIG. 2, a block diagram of an integrated circuit 200 coupled to a tester 205. The tester includes a pattern generator 210 and a test power supply 220. The pattern generator is referred to herein as a first tester and the power supply is a second tester, or parametric measurement unit. The pattern generator is used to provide reset signals to the reset connection, RS#. The power supply is selectively used to provide elevated test supplies.

A problem encountered during testing operations is that the tester coupled to the memory device provides reset signals to the reset connection using the pattern generator that supplies digital signals. When the tester enters a test mode that requires high voltage or currents, the tester switches the reset connection to a parametric measurement unit (PMU) that can supply the needed voltage/currents. As the tester disconnects the reset connection from the pattern generator to connect to the PMU, the reset connection discharges to ground. As such, the reset connection is not actively driven by an external source, which causes the chip to detect an active low signal on the Reset connection and initiates an undesired reset operation.

In one embodiment of the present invention, an active pull-up device is coupled to the reset connection. One problem with an active pull-up device is a specification typically placed on the reset connection that prohibits current draw. An active pull-up on the reset connection fights the pull-down of any system that would try to pull the reset pin low. This may not be acceptable to some users, during normal operation.

Figure 3:
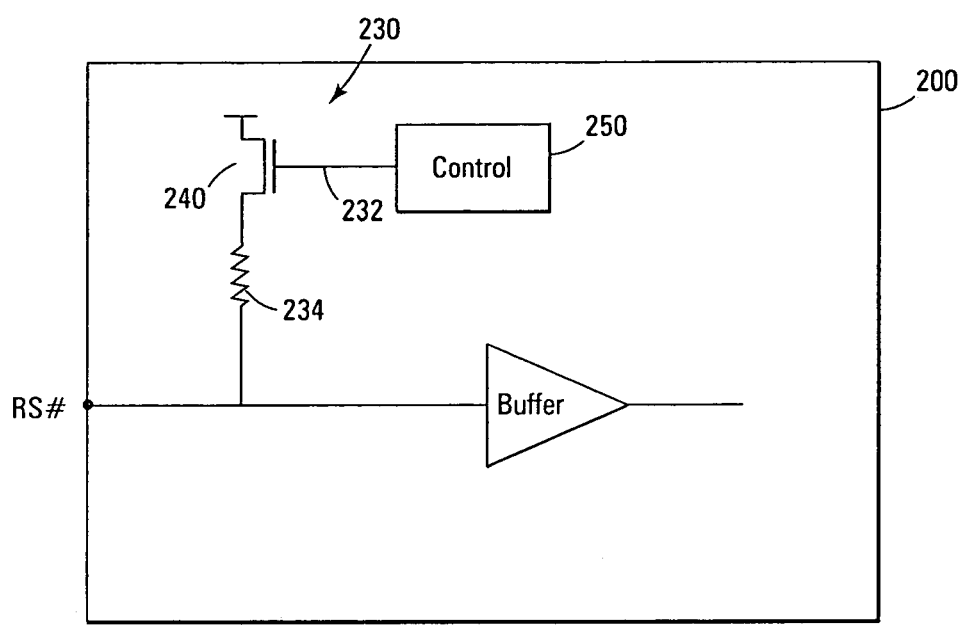
FIG. 3 is a schematic diagram of an embodiment of a memory of the present invention including a pull-up circuit.

In one embodiment, the pull-up 230 is activated through an internal signal 232 generated as a result of detection of a test mode that would require the reset connect be used as a supply, see FIG. 3. The pull-up circuit includes a current limiting resistor 234 coupled in series with a transistor 240. The transistor is activated in response to a test mode, as indicated by control circuit 250. Control circuit 250 can be the memory device command controller 131. The internal pull-up circuit prevents the reset pin from floating when the tester changes signals and the memory would not exit the test modes. The pull-up circuit needs to have the characteristic of allowing the voltage on the reset connection to go higher than Vcc. This can be done using one of many known circuits, such as the transistor being an N-channel transistor having its gate connected to Vcc. FIG. 4 illustrates an alternative embodiment where the pull-up circuit is coupled to the reset connection externally to the memory device. An external control device, such as a tester, activates the bias circuit during a test operation.

CONCLUSION

An integrated circuit has been described that includes a reset connection to reset the device in response to an externally provided signal. The reset connection is used during test operations to receive elevated supply voltages. The reset connection is coupled to a bias circuit to maintain an inactive state such that the integrated circuit is not reset during the test operation when the reset connection is not actively driven by the external supply.

Although specific embodiments have been illustrated and described herein, it will be appreciated by those of ordinary skill in the art that any arrangement, which is calculated to achieve the same purpose, may be substituted for the specific embodiment shown. This application is intended to cover any adaptations or variations of the present invention. Therefore, it is manifestly intended that this invention be limited only by the claims and the equivalents thereof.

What is claimed is:

1. An integrated circuit comprising:
   control circuitry to place the integrated circuit in a test mode;
   a reset connection to receive an externally provided active low reset signal to reset the integrated circuit, the reset connection can receive an elevated voltage during the test mode; and
   an input buffer circuit coupled to the reset connection.

2. The integrated circuit of claim 1 wherein the integrated circuit further comprises a pull-up bias circuit coupled to the reset connection, wherein the pull-up bias circuit is active only during the test mode.

3. The integrated circuit of claim 2 wherein the pull-up bias circuit comprises an n-channel transistor coupled between the reset connection and a voltage supply, Vcc, a gate of the transistor is selectively coupled to Vcc during the test mode.

4. A synchronous non-volatile memory device comprising:
   an array of non-volatile memory cells;
   control circuitry to place the memory device in a test mode in response to an external test command;
   a supply connection to receive a voltage supply, Vcc;
   a reset connection to receive an externally provided active low reset signal to reset the memory device, the reset connection can receive an elevated voltage during the test mode, where the elevated voltage is greater than Vcc; and
   an input buffer circuit coupled to the reset connection.

5. The synchronous non-volatile memory device of claim 4 wherein the synchronous non-volatile memory device further comprises a pull-up bias circuit coupled to the reset connection, wherein the pull-up bias circuit is active only during the test mode.

6. The synchronous non-volatile memory device of claim 5 wherein the pull-up bias circuit comprises an n-channel transistor coupled between the reset connection and Vcc, a gate of the transistor is selectively coupled to Vcc during the test mode.

7. A method of operating an integrated circuit comprising:
   initiating a test operation of the integrated circuit; and
   activating a bias circuit coupled to a reset connection of the integrated circuit during the test operation to bias the reset connection, wherein the reset connection can receive an elevated voltage during the test operation, where the elevated voltage is greater than Vcc.

8. The method of claim 7 wherein the reset connection is coupled to receive an active low reset signal during normal operation.

9. A method of operating an integrated circuit comprising:
   initiating a test operation of the integrated circuit; and
   activating a bias circuit coupled to a reset connection of the integrated circuit during the test operation;
   wherein the reset connection is coupled to receive an active low reset signal during normal operation;
   wherein the bias circuit is a pull-up circuit coupled to prevent the reset connection from floating during the test operation.

10. A method of operating an integrated circuit comprising:
    initiating a test operation of the integrated circuit; and
    activating a bias circuit coupled to a reset connection of the integrated circuit during the test operation;
    wherein activating the bias circuit comprises coupling a supply voltage, Vcc, to a gate of a pull-up transistor coupled between the reset connection and Vcc.

11. A method of operating an integrated circuit comprising:
    initiating a test operation of the integrated circuit;
    activating a bias circuit coupled to a reset connection of the integrated circuit during the test operation; and
    coupling an elevated voltage supply to the reset connection, wherein the elevated voltage supply is greater than a voltage supply, Vcc.

12. A method of operating an integrated circuit device comprising:
    activating a pull-up bias circuit coupled to a reset connection of the integrated circuit device;
    coupling active low reset signals to the reset connection during a test operation using a first tester;
    disconnecting the first tester from the reset connection; and
    coupling an elevated supply voltage to the reset connection.

13. The method of claim 12 wherein the pull-up bias circuit is internal to the integrated circuit device.

14. The method of claim 12 wherein the pull-up bias circuit is activated during the test operation and deactivated in non-test operations.

15. The method of claim 12 further comprises initiating a test operation of the memory device via external commands.

16. A method of operating an integrated circuit comprising:
    initiating a test operation of the integrated circuit via externally provided commands;
    activating an internal pull-up bias circuit coupled to a reset connection of the integrated circuit;
    coupling active low reset signals to the reset connection during a test operation using a first tester;
    disconnecting the first tester from the reset connection such that the reset connection is not actively driven from an outside source, wherein the activated pull-up bias circuit prohibits a voltage on the reset connection from transitioning to a low state; and
    coupling an elevated supply voltage to the reset connection during the test operation, wherein the elevated voltage supply is greater than an operating voltage supply, Vcc.

17. An integrated circuit comprising:
    control circuitry to place the integrated circuit in a test mode in response to an external test command;
    a supply connection to receive a voltage supply, Vcc;
    a reset connection to receive an externally provided active low reset signal to reset the integrated circuit;
    an input buffer circuit coupled to the reset connection; and
    a pull-up circuit coupled to the reset connection, wherein the pull-up circuit is active only during the test mode, the pull-up circuit comprises,
       a current limiting resistor coupled to the reset connection, and
       a transistor coupled between the resistor and Vcc.

18. A system comprising:
    a processor; and
    a memory device coupled to the processor, the memory device comprising:
       control circuitry to place the memory device in a test mode in response to an external test command,
       a supply connection to receive a voltage supply, Vcc,
       a reset connection to receive an externally provided active low reset signal to reset the memory device, an input buffer circuit coupled to the reset connection, and a pull-up circuit coupled to the reset connection, wherein the pull-up circuit is active only during the test mode, the pull-up circuit comprises, a current limiting resistor coupled to the reset connection, and a transistor coupled between the resistor and Vcc.

19. A test system comprising:

a first and second test devices; and a memory device selectively coupled to either the first or second test devices, the memory device comprising:

control circuitry to place the memory device in a test mode in response to an external test command, a supply connection to receive a voltage supply, Vcc, a reset connection to receive an externally provided active low reset signal to reset the memory device, an input buffer circuit coupled to the reset connection, and a pull-up circuit coupled to the reset connection, wherein the pull-up circuit is active only during the test mode, the pull-up circuit comprises, a current limiting resistor coupled to the reset connection, and a transistor coupled between the resistor and Vcc.

* * * * *